US009392686B2

(12) United States Patent
Lee

(10) Patent No.: US 9,392,686 B2
(45) Date of Patent: Jul. 12, 2016

(54) DISPLAY DEVICE

(71) Applicant: Samsung Display Co., Ltd., Yongin-si, Gyeonggi-Do (KR)

(72) Inventor: Min Woo Lee, Seoul (KR)

(73) Assignee: Samsung Display Co., Ltd., Giheung-Gu, Yongin-si, Gyeonggi-do (KR)

( * ) Notice: Subject to any disclaimer, the term of this patent is extended or adjusted under 35 U.S.C. 154(b) by 0 days.

(21) Appl. No.: 14/576,885

(22) Filed: Dec. 19, 2014

(65) Prior Publication Data
US 2016/0014880 A1     Jan. 14, 2016

(30) Foreign Application Priority Data

Jul. 8, 2014   (KR) ........................ 10-2014-0084965

(51) Int. Cl.
| H05K 7/00 | (2006.01) |
| H05K 1/02 | (2006.01) |
| H05K 5/02 | (2006.01) |
| H05K 1/14 | (2006.01) |
| G06F 1/16 | (2006.01) |
| G02F 1/1333 | (2006.01) |
| H04N 5/64 | (2006.01) |

(52) U.S. Cl.
CPC ............. *H05K 1/028* (2013.01); *G02F 1/1333* (2013.01); *G06F 1/16* (2013.01); *H05K 5/02* (2013.01); *G02F 1/133308* (2013.01); *G02F 2201/46* (2013.01); *G06F 1/1637* (2013.01); *H04N 5/64* (2013.01); *H05K 1/147* (2013.01)

(58) Field of Classification Search
CPC .................. G02F 1/133308; G02F 2201/465; G02F 1/133608; G02F 2001/133317; G02F 2201/46; G02F 1/13452; G06F 1/1637; H04M 1/0266; H04M 1/0268; F21V 17/06; F21V 19/009; F21V 21/00; H05K 1/147; H05K 2201/10681; H05K 3/361
USPC .......... 361/679.21, 679.24, 679.26, 749, 756, 361/759; 349/58, 60, 150, 151; 362/217.16, 362/217.17, 225, 633, 634; 345/905
See application file for complete search history.

(56) References Cited

U.S. PATENT DOCUMENTS

| 8,197,113 | B2 * | 6/2012 | Park ..................... G02B 6/0083 362/612 |
| 8,599,329 | B2 | 12/2013 | Kang et al. |
| 2007/0165424 | A1 * | 7/2007 | Sakai ................... G02B 6/0055 362/633 |

(Continued)

FOREIGN PATENT DOCUMENTS

| KR | 10-1996-0005158 | 2/1996 |
| KR | 20-1998-0064322 | 11/1998 |
| KR | 10-2008-0000474 | 1/2008 |

(Continued)

*Primary Examiner* — Hung S Bui
*Assistant Examiner* — James Wu
(74) *Attorney, Agent, or Firm* — Robert E. Bushnell, Esq.

(57) ABSTRACT

A display device includes having a display panel, a light source disposed on a rear surface of the display panel, and an optical member disposed between the display panel and the light source. An optical member supporter is configured to support at least one side of the optical member and includes at least one pair of a first hook and a second hook formed on a rear surface. The display device also includes a bottom chassis having a first inserting hole and a second inserting hole into which the first hook and the second hook are respectively inserted, a driving circuit substrate disposed between the bottom chassis and the second hook, and at least one flexible printed circuit board configured to connect the display panel and the driving circuit substrate.

14 Claims, 7 Drawing Sheets

(56) References Cited

U.S. PATENT DOCUMENTS

2009/0122220 A1* 5/2009 Ko .................... G02F 1/133308
349/58

FOREIGN PATENT DOCUMENTS

| KR | 10-2008-0021305 | 3/2008 |
| KR | 10-2012-0030802 | 3/2012 |

* cited by examiner

DISPLAY DEVICE

This application makes reference to, incorporates the same herein, and claims all benefits accruing under 35 U.S.C. §119 from an application earlier filed in the Korean Intellectual Property Office on 8 Jul. 2014 and there duly assigned Serial No. 10-2014-0084965.

BACKGROUND

1. Field of Invention

The present disclosure of invention relates to a liquid crystal display device designed to fix a driving circuit substrate without an additional apparatus.

2. Description of the Related Art

A liquid crystal display (LCD) is a type of flat panel displays (FPDs), which is the most widely used these days. The LCD includes two substrates including electrodes formed thereon and a liquid crystal layer interposed therebetween. Upon applying voltage to the electrodes, liquid crystal molecules of the liquid crystal layer are rearranged, thereby adjusting the amount of transmitted light.

A liquid crystal display (LCD) includes a display panel configured to display an image and a backlight unit (BLU) configured to provide light to the display panel. The BLU is classified into three types depending on the position of a light source: a direct type, an edge type, and a corner type.

The edge type BLU includes a light guide plate and a light source disposed on one side of the light guide plate and an LCD panel is provided with light emitted from the light source through the light guide plate. The direct type BLU includes a plurality of light sources disposed under the LCD panel and therefore is advantageous over the edge type BLU in that luminance is enhanced and a large-sized surface is available to use for light emission.

Meanwhile, in order to drive the LCD panel, driving printed circuit boards (PCB) are connected along at least one side surface of the LCD panel using a chip on film (COF) or a tape carrier package (TCP). The COF or the TCP are provided with circuit lines formed on an element having a panel form that is thin and capable of being bent, such that electric signals of the driving circuit substrate can be applied to the LCD panel.

In general, the PCB is disposed in contact with a rear surface of the bottom chassis so as to reduce the volume in a molding process. Thus, the COF or the TCP that connects the LCD panel and the PCB is bent toward the side surface of the bottom chassis.

The PCB can be fixed to the rear surface of the bottom chassis using a double-sided adhesive tape, a mold holder, or the like. However, in a case where the double-sided adhesive tape is used, adhesion deteriorates in a high temperature. Further, in a case where the mold holder is used, additional apparatuses and assembling processes may result in increased mold production cost and increased number of processes.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF THE INVENTION

The present disclosure of invention is directed to a liquid crystal display device designed to fix a driving circuit substrate without an additional apparatus.

According to an embodiment of the present invention, a display device may include: a display panel; a light source disposed on a rear surface of the display panel; an optical member disposed between the display panel and the light source; an optical member supporter configured to support at least one side of the optical member and including at least one pair of a first hook and a second hook formed on a rear surface; a bottom chassis having a first inserting hole and a second inserting hole into which the first hook and the second hook are respectively inserted; a driving circuit substrate disposed between the bottom chassis and the second hook; and at least one flexible printed circuit board configured to connect the display panel and the driving circuit substrate.

At least one of the first hook and the second hook may include an inserting body extended from the rear surface of the optical member supporter in a perpendicular direction and a hooking unit extended outwards from the inserting body.

The first hook may include a first inserting body having a smaller width compared to the first inserting hole and a first hooking unit having a larger width compared to the first inserting hole.

The second hook may include a second inserting body and a second hooking unit and a total width of the second inserting body and the second hooking unit is smaller than a width of the second inserting hole.

The second hook may pass through the second inserting hole, slide toward the first hook, and fix the driving circuit substrate.

The inserting body of the second hook may have a larger length compared to the inserting body of the first hook.

A distance between the second hooking unit and the bottom chassis may be substantially the same as a thickness of the driving circuit substrate.

An insulating member may be further disposed between the driving circuit substrate and the bottom chassis.

A distance between the first hooking unit and the second inserting body may be larger than a width of the driving circuit substrate.

The first hook and the second hook may be collinearly disposed.

The first hook may be disposed outwards from the bottom chassis compared to the second hook.

The respective one or more first hooks may be disposed in parallel with each other.

The respective one or more second hooks may be disposed in parallel with each other.

The first hook and the second hook may be disposed between the adjacent flexible printed circuit boards.

The first hook and the second hook may be respectively disposed between the adjacent flexible printed circuit boards.

The optical member supporter, the first hook, and the second hook may be formed together by injection molding.

According to embodiments of the present invention, a display device can fix the driving circuit substrate without an additional apparatus.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
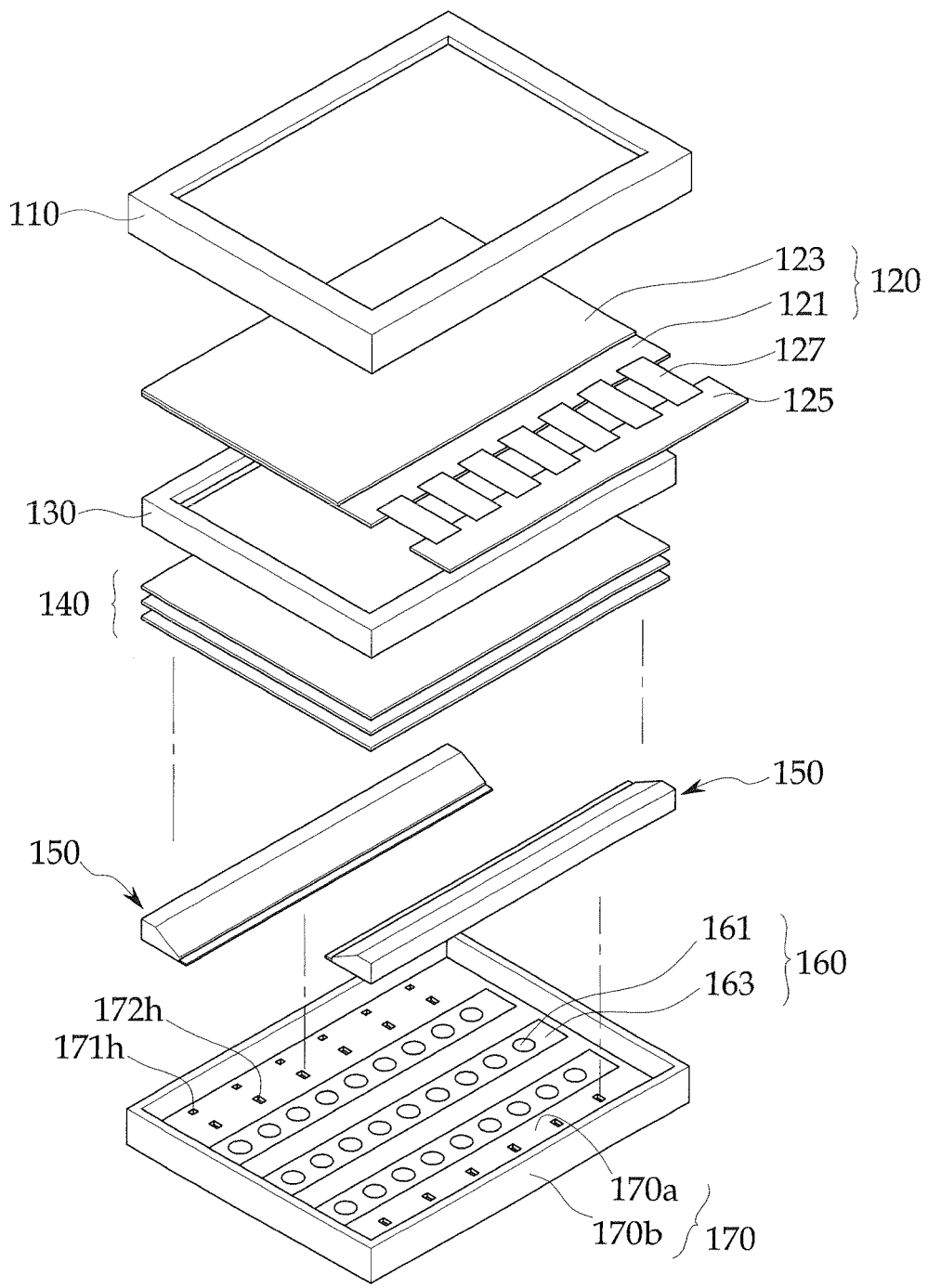
FIG. 1 is an exploded perspective view illustrating a display device according to an embodiment of the present invention.

Hereinafter, embodiments of the present disclosure of invention will be described in more detail with reference to the accompanying drawings.

Although the present invention can be modified in various manners and have several embodiments, specific embodiments are illustrated in the accompanying drawings and will be mainly described in the specification. However, the scope of the embodiments of the present invention is not limited to the specific embodiments and should be construed as including all the changes, equivalents, and substitutions included in the spirit and scope of the present invention.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Some of the parts which are not associated with the description may not be provided in order to specifically describe embodiments of the present invention, and like reference numerals refer to like elements throughout the specification.

Hereinafter, it is assumed that an LCD is used as a display device according to an embodiment of the present invention. However, it is obvious that the present invention can be applied to an OLED or a PDP other than the LCD.

FIG. 1 is an exploded perspective view illustrating a display device according to an embodiment of the present invention.

Referring to FIG. 1, the display device according to an embodiment of the present invention may include a top chassis 110, a display panel 120, a mold frame 130, an optical member 140, an optical member supporter 150, a light source unit 160, and a bottom chassis 170. Hereinafter, a backlight unit is to be understood as having a concept including the mold frame 130, the optical member 140, the optical member supporter 150, the light source unit 160, and the bottom chassis 170.

It is assumed that a direct type display device in which the light source unit 160 is disposed on a rear surface of the display panel 120 is used as a display device according to an embodiment of the present invention.

The top chassis 110 is coupled to the mold frame 130 and the bottom chassis 170 so as to cover the display panel 120 mounted on the mold frame 130. The top chassis 110 has an open window located in the middle to expose the display panel 120. The top chassis 110 may be coupled to the mold frame 130 and the bottom chassis 170 by hooks and/or screws.

The display panel 120 is provided in a panel form having a quadrilateral cross-section configured to display an image using light. Various types of display panels including an LCD or an electrophoretic display may be used as the display panel 120. It is assumed that the LCD is used as the display panel 120 according to an embodiment of the present invention.

The display panel 120 may include a first substrate 121, a second substrate 123 disposed to face the first substrate 121, and a liquid crystal layer (not illustrated) disposed between the first substrate 121 and the second substrate 123.

The first substrate 121 may include a plurality of pixel electrodes arranged in a matrix form, a thin film transistor configured to apply a driving voltage to the respective pixel electrodes, and various signal lines configured to drive the pixel electrodes and the thin film transistor.

The second substrate 123 is disposed to face the first substrate 121 and may include a common electrode formed of a transparent conductive material and a color filter. The color filter has types of red, green, and blue color filters.

The liquid crystal layer (not illustrated) is interposed between the first substrate 121 and the second substrate 123 and rearranged in accordance with an electric field formed between the pixel electrode and the common electrode. Accordingly, the rearranged liquid crystal layer adjusts transmittance of light emitted from the BLU and the adjusted light passes through the color filter, such that an image can be displayed.

In addition, although not illustrated in FIG. 1, polarizing plates (not illustrated) may be respectively attached to a rear surface of the first substrate 121 and a top surface of the second substrate 123. The polarizing plate may have an area corresponding to the display panel. The polarizing plate only allows light having a predetermined polarization direction among light emitted from the backlight unit and light having a predetermined polarization direction among light incident from the outside to pass through and absorbs or blocks the other light.

A driving circuit substrate 125 may be disposed on at least one side of the display panel 120. The driving circuit substrate 125 may apply driving signals to the various signal lines disposed on the first substrate 121. The driving circuit substrate 125 may include a gate driving circuit substrate configured to apply scan signals and a data driving circuit substrate configured to apply data signals. In FIG. 1, the driving circuit substrate 125 is disposed on only one side of the display panel 120; however, embodiments of the present invention are not limited thereto.

The display panel 120 and the driving circuit substrate 125 are electrically connected by at least one of a flexible printed circuit board 127. One end portion of the flexible printed circuit board 127 overlaps a part of the first substrate 121 and is electrically connected to the first substrate 121. The other end portion of the flexible printed circuit board 127 overlaps a part of the driving circuit substrate 125 and is electrically connected to the driving circuit substrate 125. The flexible printed circuit board 127 may be, for example, the COF or the TCP. Hereinafter, it is assumed that the COF is used as the flexible printed circuit board 127. In FIG. 1, it is illustrated that seven flexible printed circuit boards 127 are disposed. However, embodiments of the present invention are not limited thereto, and thus the number of the flexible printed circuit boards 127 may be adjustable depending on the size and the driving methods of the display panels.

A driving chip (not illustrated) may be mounted on the flexible printed circuit board 127. The driving chip may generate various driving signals for driving the display panel 120. The driving chip is formed by integrating a timing controller and a data driving circuit in a single chip. The driving chip may be expressed as a driver integrated circuit (IC) or a source integrated circuit (IC).

The plurality of flexible printed circuit boards 127 attached on one side of the display panel 120 are bent along the mold frame 130 and a side surface 170b of the bottom chassis 170. The driving circuit substrate 125 is disposed on an edge portion of a rear surface of the bottom chassis 170 described below.

The mold frame 130 has a quadrilateral-loop form and accommodates and supports the display panel 120, the optical member 140, and the like inside the quadrilateral-loop form.

The optical member 140 may be disposed between the light source unit 160 and the display panel 120 and is configured to diffuse and/or collect light transmitted from the light source unit 160. The optical member 140 may include a diffusion sheet, a prism sheet, and a protective sheet. In FIG. 1, it is illustrated that three optical members 140 are provided; however, two, four, or more optical sheets may be provided.

The diffusion sheet is configured to disperse light incident from the light source unit 160 so as to prevent the light from being partly concentrated.

The prism sheet may include prisms having a triangular cross-section and aligned in a predetermined arrangement on one surface thereof. The prism sheet may be disposed on the diffusion sheet and may collect light diffused from the diffusion sheet in a direction perpendicular to the display panel 120.

The protective sheet may be formed on the prism sheet and may protect a surface of the prism sheet and diffuse light to achieve a uniform light distribution.

The optical member supporter 150 may be fixed to the bottom chassis 170 and supports the optical member 140. The optical member supporter 150 may be disposed on at least one edge portion of the bottom surface 170a of the bottom chassis 170. More particularly, the optical member supporter 150 according to an embodiment of the present invention may be disposed on the edge portion of the bottom chassis 170 on which the driving circuit substrate 125 is disposed. A configuration of the optical member supporter 150 will be described in detail in FIG. 2.

The light source unit 160 may include a light source 161 and a circuit substrate 163 on which the light source 161 is disposed. The light source 161 may be disposed on the bottom surface 170a of the bottom chassis 170. The light source 161 may include at least one LED chip (not illustrated) and a package (not illustrated) for accommodating the LED chip. For example, the LED chip (not illustrated) may be a gallium nitride (GaN)-based LED chip that emits blue light. The number of the LED chips (not illustrated) may be adjustable in consideration of size and luminance uniformity of the display panel 120. The circuit substrate 163 may be a printed circuit board (PCB) or a metal PCB.

The bottom chassis 170 may be formed of a metal material having rigidity properties such as stainless steel or a material having good heat dissipation properties such as aluminum or an aluminum alloy. The bottom chassis 170 has a bottom surface 170a, a side surface 170b, and a rear surface (not illustrated) and is configured to maintain a framework of the display device and protect a variety of elements accommodated therein. The bottom chassis 170 has at least one pair of a first and a second inserting holes 171h and 172h for fixing the optical member supporter 150 to one edge portion of the bottom surface 170a. A movement of coupling the optical member supporter 150 and the bottom chassis 170 will be described in FIGS. 3 and 4.

Figure 2A:
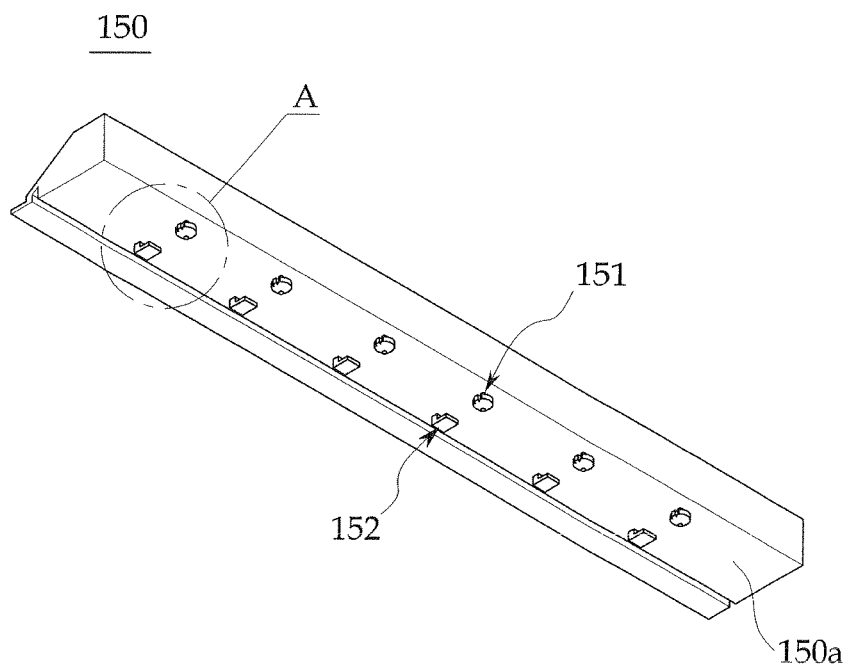
FIG. 2A is a perspective view illustrating an optical member supporter according to an embodiment of the present invention.
Figure 2B:
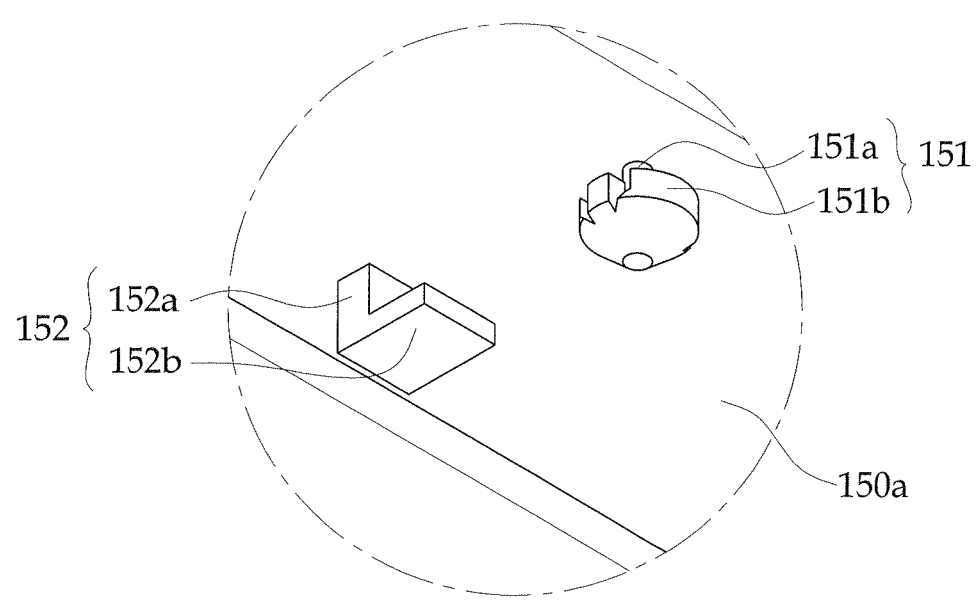
FIG. 2B is a perspective view enlarging an 'A' part of FIG. 2A.

FIG. 2A is a perspective view illustrating an optical member supporter according to an embodiment of the present invention and FIG. 2B is a perspective view enlarging an 'A' part of FIG. 2A.

Referring to FIGS. 2A and 2B, the optical member supporter 150 according to an embodiment of the present invention may include at least one pair of a first and a second hooks 151 and 152 formed on a rear surface 150a.

The first and the second hooks 151 and 152 may be provided in a pair and the optical member supporter 150 may include at least one pair of the first and the second hooks 151 and 152 formed on a rear surface. In this case, the first and the second hooks 151 and 152 may be collinearly disposed and the first hook 151 may be formed outside (outwards) compared to the second hook 152. The first and the second hooks 151 and 152 are respectively inserted into the first and the second inserting holes 171h and 172h.

Further, the respective one or more first hooks 151 may be formed in parallel with each other and the respective one or more second hooks 152 may be formed in parallel with each other.

Referring to FIG. 2B, the first hook 151 may include a first inserting body 151a extended from the rear surface of the optical member supporter 150 in a perpendicular direction, a first hooking unit 151b extended outwards from the first inserting body 151a. In FIG. 2B, the first hooking unit 151b is depicted as having a hemisphere form. However, embodiments of the present invention are not limited thereto, and thus the first hooking unit 151b may have a variety of forms, such as a sphere or a polypyramid form. The first hooking unit may be inserted into the first inserting hole 171h in a pressing manner.

The second hook 152 may include a second inserting body 152a extended from the rear surface of the optical member supporter 150 in a perpendicular direction and a second hooking unit 152b extended outwards from the second inserting body 152a. The second hooking unit 152b may be inserted into the second inserting hole 172h in a sliding manner.

The optical member supporter 150 may be formed including acrylic resins such as polymethylmethacrylate (PMMA) or plastic materials such as polycarbonate (PC). More particularly, the first and the second hooks 151 and 152 formed on the bottom surface of the optical member supporter 150 may be formed together by an injection molding.

Figure 3:
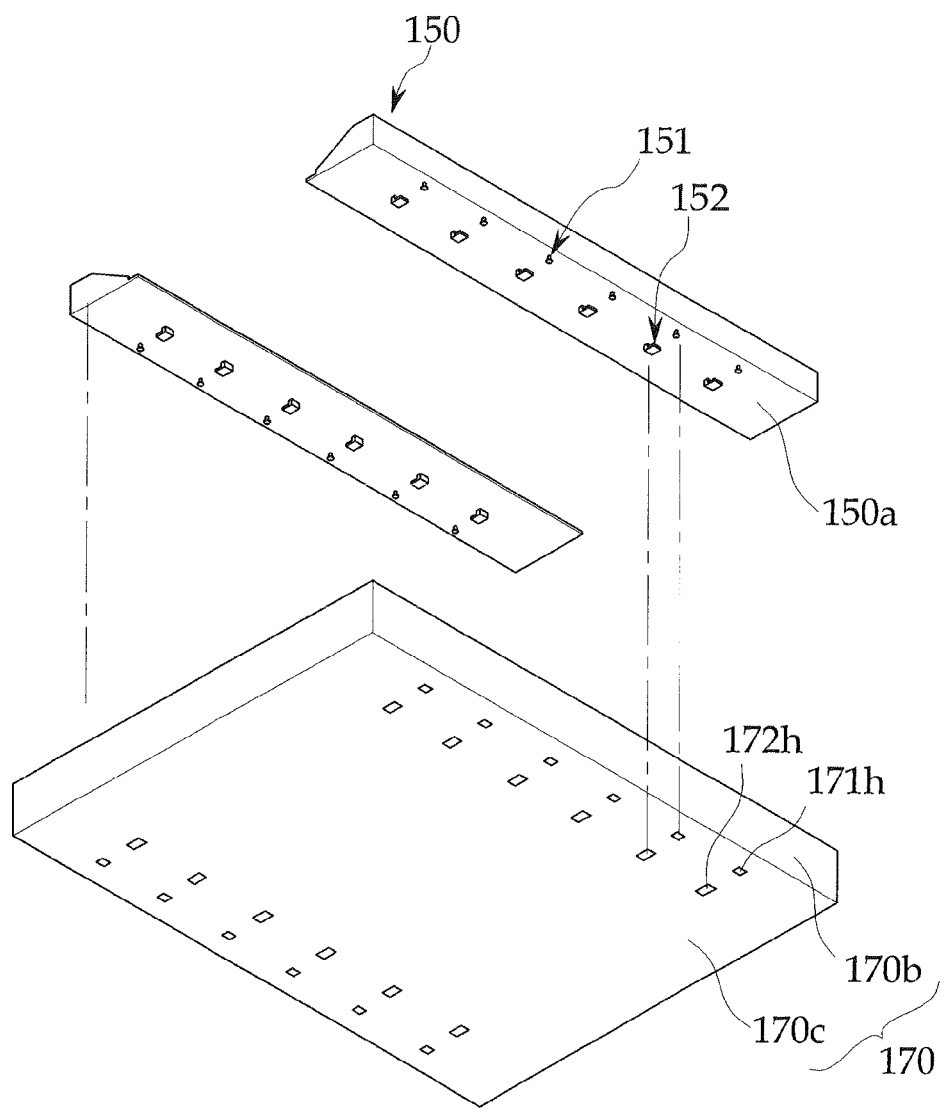
FIG. 3 is a rear perspective view illustrating a method of coupling the optical member supporter to a bottom chassis according to an embodiment of the present invention.
Figure 4:
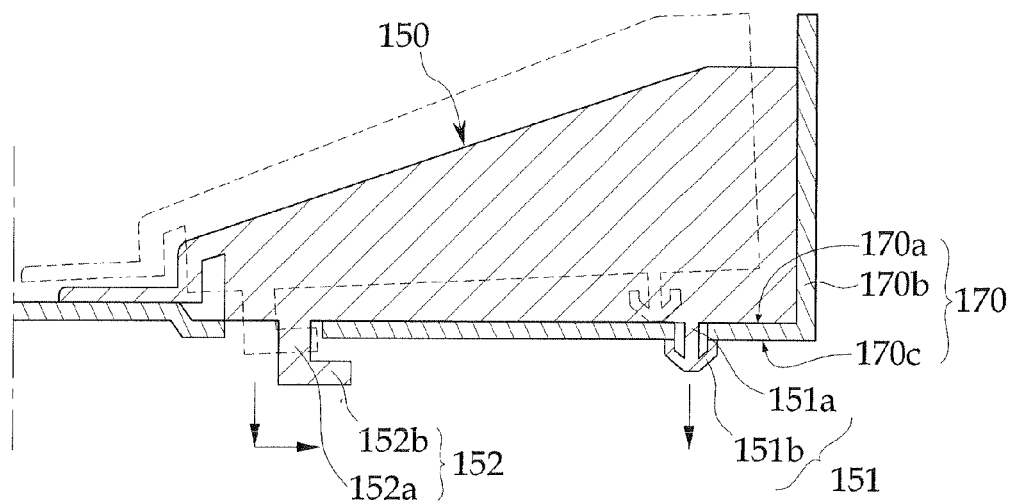
FIG. 4 is a cross-sectional view illustrating a method of coupling the optical member supporter to a bottom chassis according to an embodiment of the present invention.

FIG. 3 is a rear perspective view illustrating a method of coupling the optical member supporter to a bottom chassis according to an embodiment of the present invention and FIG. 4 is a cross-sectional view illustrating a method of coupling the optical member supporter to a bottom chassis according to an embodiment of the present invention.

Referring to FIGS. 3 and 4, the optical supporter 150 may be accommodated in the edge portion of the bottom surface 170a of the bottom chassis 170 and fixed thereto. In this case, the bottom surface 150a of the optical member supporter 150 and the bottom surface 170a of the bottom chassis 170 becomes in contact with and fixed to each other.

In more detail, the second hook 152 disposed on the bottom surface 150a of the optical member supporter 150 passes through the second inserting hole 172h formed on the bottom surface 170a of the bottom chassis 170 and moves toward outside (outwards) in a sliding manner and the first hook 151 disposed on the bottom surface 150a of the optical member supporter 150 is inserted into the first inserting hole 171h formed on the bottom surface 170a of the bottom chassis 170 in an inserting manner, such that the optical member supporter 150 can be fixed to the bottom chassis 170.

The first inserting body 151a of the first hook 151 may have a smaller width compared to the first inserting hole 171h and the first hooking unit 151b of the first hook 151 may have a larger width compared to the first inserting hole 171h. Therefore, in a case the first hooking unit 151b is inserted into the first inserting hole 171h in a force exerting manner, the optical member supporter 150 may be fixed to the bottom chassis 170 without being separated from the bottom chassis 170.

The second hook 152 may include the second inserting body 152a and the second hooking unit 152b and the total width of the second inserting body 152a and the second hooking unit 152b may be smaller compared to a width of the second inserting hole 172h.

Further, the inserting body 152a of the second hook 152 may have a longer length compared to the inserting body 151a of the first hook 151.

The second inserting body 152a of the second hook 152 passes through the second inserting hole 172h and slides toward the first hook 151 as adjacently as possible and the first inserting body 151a of the first hook 151 is then inserted into the first inserting hole 171h, such that the optical member supporter 150 may be stably fixed to the bottom chassis 170.

Figure 5:
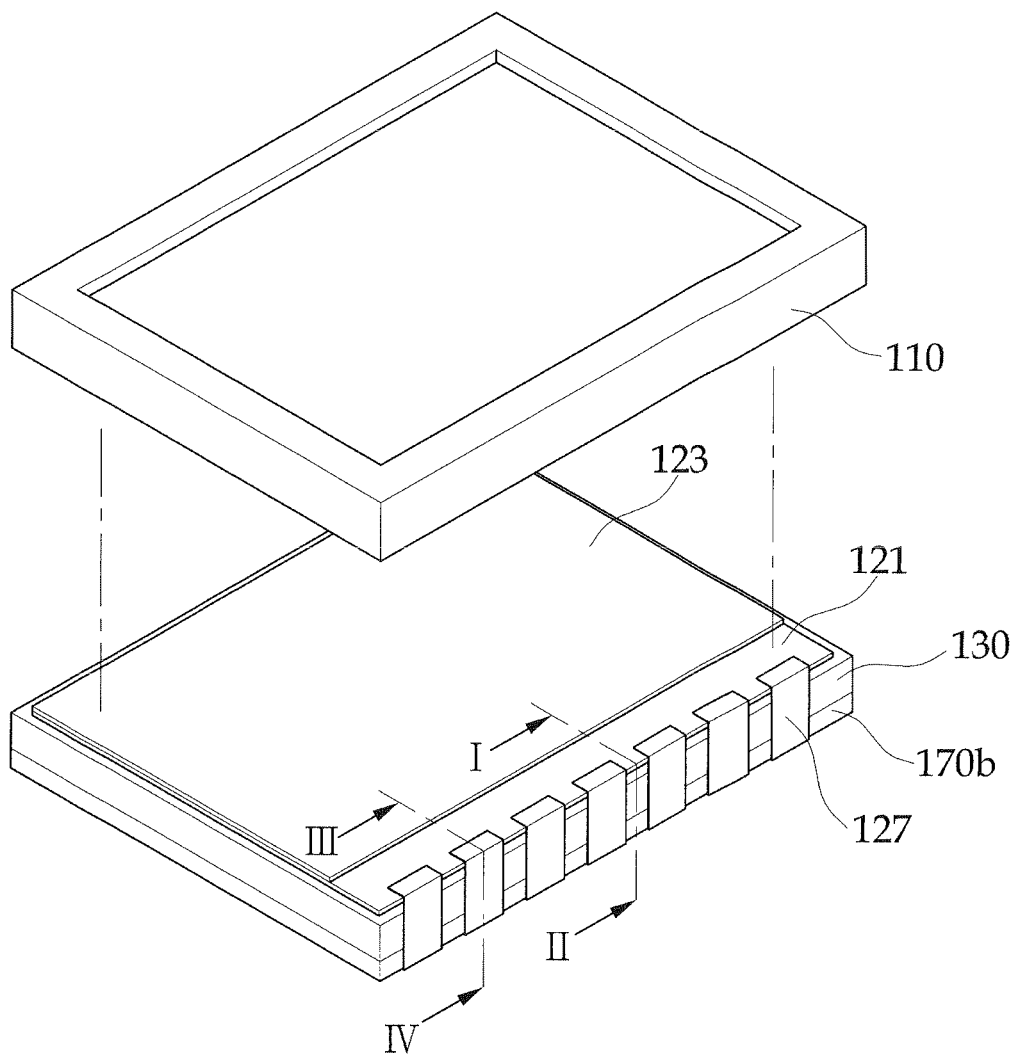
FIG. 5 is a perspective view illustrating a coupling structure of the display device according to an embodiment of the present invention.
Figure 6:
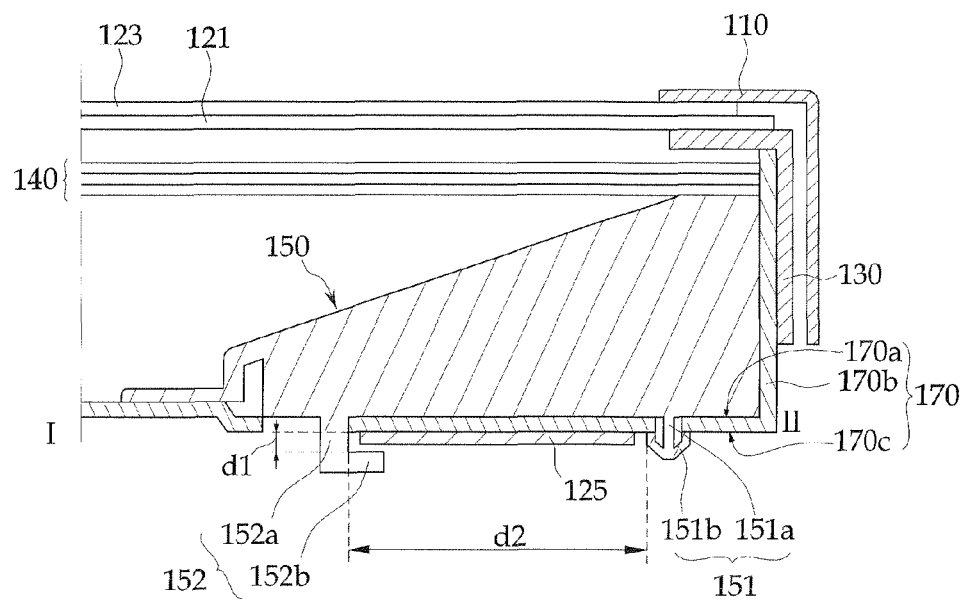
FIG. 6 is a cross-sectional view taken along a line I-II of FIG. 5.
Figure 7:
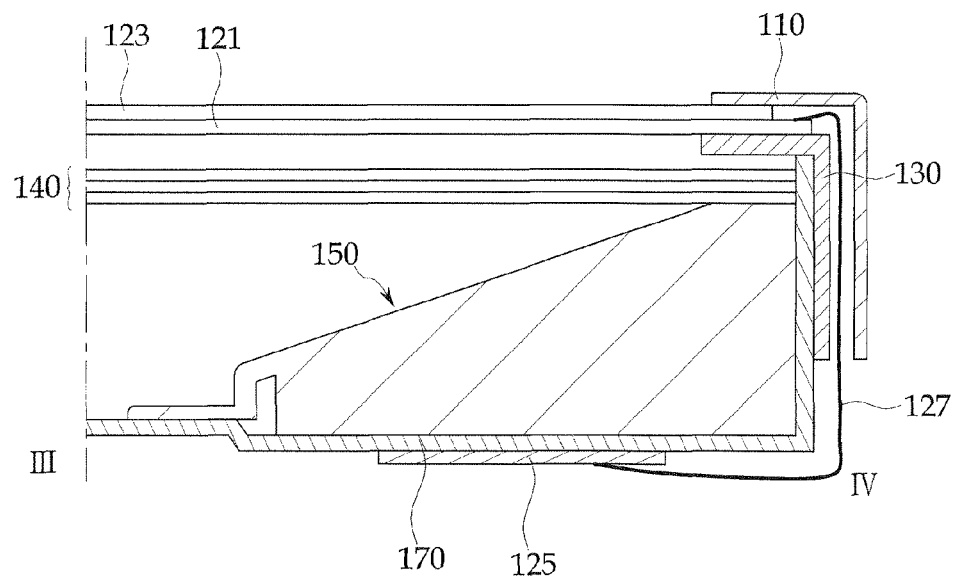
FIG. 7 is a cross-sectional view taken along a line III-IV of FIG. 5.

FIG. 5 is a perspective view illustrating a coupling structure of the display device according to an embodiment of the present invention, FIG. 6 is a cross-sectional view taken along a line I-II of FIG. 5, and FIG. 7 is a cross-sectional view taken along a line III-IV of FIG. 5.

Referring to FIGS. 5 to 7, the optical member supporter 150 is coupled to the bottom chassis 170 and one edge portion of the plurality of optical members 140 are mounted on the optical member supporter 150. Subsequently, the mold frame 130, the display panel 120, and the top chassis 110 are sequentially assembled. The plurality of flexible printed circuit boards 127 connected to one side of the display panel 120 are bent along the side surface 170b of the bottom chassis 170 and the driving circuit substrate 125 is disposed on an edge portion of the rear surface 170c of the bottom chassis 170.

The driving circuit substrate 125 may be inserted into a space between the rear surface 170c of the bottom chassis 170 and the second hooking unit 152b of the second hook 152. Although not illustrated in FIG. 6, an insulating member (not illustrated) may be further disposed between the driving circuit substrate 125 and the rear surface 170c of the bottom chassis 170. Therefore, a distance d1 between the rear surface 170c of the bottom chassis 170 and the second hooking unit 152b of the second hook 152 may be substantially the same as or slightly larger than a thickness of the driving circuit substrate 125. Further, a distance d2 between the first hooking unit 151b and the second inserting body 152a may be larger than a width of the driving circuit substrate.

Figure 8:
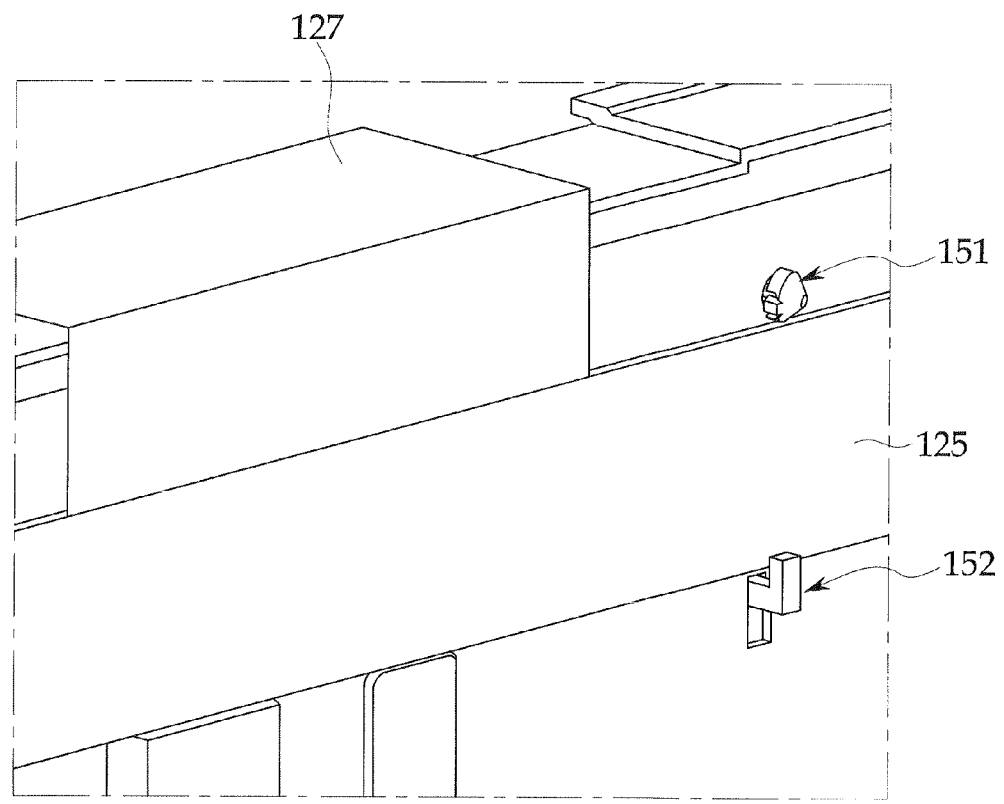
FIG. 8 is a rear view of FIG. 5.

FIG. 8 is a rear view of FIG. 5. Referring to FIG. 8, the first hook 151 and the second hook 152 may be disposed between the adjacent flexible printed circuit boards 127. In more detail, the first hook 151 and the second hook 152 may be respectively disposed between the adjacent flexible printed circuit boards 127.

Accordingly, the display device according to an embodiment of the present invention may include the first hook and the second hook formed on the rear surface of the conventional optical member supporter, thereby capable of fixing the optical member supporter to the bottom chassis and also capable of fixing the driving circuit substrate disposed on the rear surface of the bottom chassis. In other words, according to an embodiment of the present invention, a conventionally existing element has been partly modified without adding a separate apparatus for fixing the driving circuit substrate, thereby providing a display device that has a simple structure and is easy to be assembled.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. A display device comprising:
   a display panel;
   a light source disposed on a rear surface of the display panel;
   an optical member disposed between the display panel and the light source;
   a pair of optical member supporters configured to support opposite sides of one surface of the optical member and each optical member supporter comprising a plurality of first hooks and a plurality of second hooks formed on a rear surface of each of the optical members supporters, the plurality of first and second hooks are each positioned in separate parallel rows;
   a bottom chassis having a plurality of first inserting holes and a plurality of second inserting holes into which the plurality of first hooks and the plurality of second hooks are respectively inserted;
   a driving circuit substrate disposed between the bottom chassis and the plurality of second hooks of one of the pair of optical member supporters; and at least one flexible printed circuit board configured to connect the display panel and the driving circuit substrate,
   wherein the light source is disposed between the pair of optical member supporters.

2. The display device of claim 1, wherein the plurality of first hooks and the plurality of second hooks each comprises an inserting body extending from the rear surface of the optical member supporter in a perpendicular direction and a hooking unit extending outwards from the inserting body.

3. The display device of claim 2, wherein each of the plurality of first hooks comprises a first inserting body having a width smaller than anyone of the plurality of first inserting holes and a first hooking unit having a width larger than anyone of the plurality of first inserting holes.

4. The display device of claim 3, wherein each of the plurality of second hooks comprises a second inserting body and a second hooking unit and a total width of the second inserting body and the second hooking unit is smaller than a width anyone of the plurality of second inserting holes.

5. The display device of claim 1, wherein each of the second hooks passes through each of the second inserting holes, slides toward each of the first hooks, and fixes the driving circuit substrate.

6. The display device of claim 4, wherein the inserting body of each of the second hooks has a length larger than the inserting body of anyone of the first hooks.

7. The display device of claim 4, wherein a distance between each of the second hooks and the bottom chassis is substantially the same as a thickness of the driving circuit substrate.

8. The display device of claim 4, wherein a distance between each of the first hooks and the second inserting body is larger than a width of the driving circuit substrate.

9. The display device of claim 1, wherein one of the plurality of first hooks and one of the plurality of second hooks are arranged in pairs and collinearly disposed.

10. The display device of claim 9, wherein the row of first hooks is disposed outwards from the bottom chassis compared to the row of second hooks.

11. The display device of claim 9, wherein the plurality of first hooks are disposed in parallel with each other.

12. The display device of claim 9, wherein the plurality of second hooks are disposed in parallel with each other.

13. The display device of claim 1, wherein there are at least two flexible printed circuit boards, and one of the plurality of first hooks and one of the plurality of second hooks are disposed between adjacent flexible printed circuit boards.

14. The display device of claim 1, wherein the pair of optical member supporters, the plurality of first hooks, and the plurality of second hooks are formed together by injection molding.

* * * * *